(12) United States Patent  
Parthasarathy et al.

(10) Patent No.: US 8,829,570 B2
(45) Date of Patent: Sep. 9, 2014

(54) SWITCHING DEVICE FOR HETEROJUNCTION INTEGRATED CIRCUITS AND METHODS OF FORMING THE SAME

(75) Inventors: Srivatsan Parthasarathy, Marlborough, MA (US); Javier A. Salcedo, North Billerica, MA (US); Shuyun Zhang, Allston, MA (US)

(73) Assignee: Analog Devices, Inc., Norwood, MA (US)

( * ) Notice: Subject to any disclaimer, the term of this patent is extended or adjusted under 35 U.S.C. 154(b) by 84 days.

(21) Appl. No.: 13/416,152

(22) Filed: Mar. 9, 2012

(65) Prior Publication Data
US 2013/0234209 A1 Sep. 12, 2013

(51) Int. Cl.
*H01L 33/00* (2010.01)
(52) U.S. Cl.
USPC .................................. 257/197; 257/E29.033
(58) Field of Classification Search
USPC .......................................... 257/197, E29.033
See application file for complete search history.

(56) References Cited

U.S. PATENT DOCUMENTS

| | | | |
|---|---|---|---|
| 3,436,667 A | 4/1969 | Leonard | |
| 4,633,283 A | 12/1986 | Avery | |
| 5,061,652 A | 10/1991 | Bendernagel et al. | |
| 5,276,582 A | 1/1994 | Merrill et al. | |
| 5,341,005 A | 8/1994 | Canclini | |
| 5,343,053 A | 8/1994 | Avery | |
| 5,652,689 A | 7/1997 | Yuan | |
| 5,663,860 A | 9/1997 | Swonger | |
| 5,742,084 A | 4/1998 | Yu | |
| 5,781,389 A | 7/1998 | Fukuzako et al. | |
| 5,786,617 A | 7/1998 | Merrill et al. | |
| 5,889,644 A | 3/1999 | Schoenfeld et al. | |
| 5,895,840 A | 4/1999 | Ohuchi et al. | |
| 5,895,940 A | 4/1999 | Kim | |
| 5,998,813 A | 12/1999 | Bernier | |

(Continued)

FOREIGN PATENT DOCUMENTS

| | | |
|---|---|---|
| DE | 10 2007 040 875 A1 | 3/2009 |
| EP | 0 168 678 A2 | 1/1986 |

(Continued)

OTHER PUBLICATIONS

Anderson et al., *ESD Protection under Wire Bonding Pads*, EOS/ESD Symposium 99-88, pp. 2A.4.1-2A.4.7 (1999).

(Continued)

*Primary Examiner* — Amar Movva
(74) *Attorney, Agent, or Firm* — Knobbe, Martens, Olson & Bear LLP

(57) ABSTRACT

A switching device for heterojunction integrated circuits is disclosed. According to one aspect, the switching device is configured to protect a circuit from an electro-static discharge (ESD) event. The switching device includes a second base contact region that is configured to be electrically floating, a first base contact region and a collector contact region that are coupled to a first input terminal of the switching device, and an emitter contact region that is coupled to a second input terminal of the switching device. Due in part to capacitive coupling between the first base contact region and the second base contact region, the switching device exhibits a low transient trigger voltage and a fast response to ESD events. Further, the switching device exhibits a high DC trigger voltage (for example, greater than 20V), while maintaining relatively low leakage current during operation (for example, less than about 0.5 μA at 20V DC.

26 Claims, 6 Drawing Sheets

(56) References Cited

U.S. PATENT DOCUMENTS

| | | | |
|---|---|---|---|
| 6,137,140 A | 10/2000 | Efland et al. |
| 6,144,542 A | 11/2000 | Ker et al. |
| 6,236,087 B1 | 5/2001 | Daly et al. |
| 6,258,634 B1 | 7/2001 | Wang et al. |
| 6,310,379 B1 | 10/2001 | Andresen et al. |
| 6,329,694 B1 | 12/2001 | Lee et al. |
| 6,403,992 B1 | 6/2002 | Wei |
| 6,404,261 B1 | 6/2002 | Grover et al. |
| 6,423,987 B1 | 7/2002 | Constapel et al. |
| 6,512,662 B1 | 1/2003 | Wang |
| 6,590,273 B2 | 7/2003 | Okawa et al. |
| 6,665,160 B2 | 12/2003 | Lin et al. |
| 6,667,870 B1 | 12/2003 | Segervall |
| 6,704,180 B2 | 3/2004 | Tyler et al. |
| 6,724,603 B2 | 4/2004 | Miller et al. |
| 6,756,834 B1 | 6/2004 | Tong et al. |
| 6,768,616 B2 | 7/2004 | Mergens et al. |
| 6,870,202 B2 | 3/2005 | Oka |
| 6,960,792 B1 | 11/2005 | Nguyen |
| 7,034,363 B2 | 4/2006 | Chen |
| 7,038,280 B2 | 5/2006 | Righter |
| 7,071,528 B2 | 7/2006 | Ker et al. |
| 7,232,705 B2 | 6/2007 | Righter |
| 7,232,711 B2 | 6/2007 | Gambino et al. |
| 7,335,543 B2 | 2/2008 | Chen et al. |
| 7,345,341 B2 | 3/2008 | Lin et al. |
| 7,385,793 B1 | 6/2008 | Ansel et al. |
| 7,436,640 B2 | 10/2008 | Su et al. |
| 7,566,914 B2 | 7/2009 | Salcedo et al. |
| 7,570,467 B2 | 8/2009 | Watanabe |
| 7,601,991 B2 | 10/2009 | Salcedo et al. |
| 7,663,190 B2 | 2/2010 | Vinson |
| 7,714,357 B2 | 5/2010 | Hayashi et al. |
| 7,834,378 B2 | 11/2010 | Ryu et al. |
| 7,910,999 B2 | 3/2011 | Lee et al. |
| 7,969,006 B2 | 6/2011 | Lin et al. |
| 8,044,457 B2 | 10/2011 | Salcedo et al. |
| 8,198,651 B2 | 6/2012 | Langguth et al. |
| 8,222,698 B2 | 7/2012 | Salcedo et al. |
| 8,368,116 B2 | 2/2013 | Salcedo et al. |
| 8,432,651 B2 | 4/2013 | Salcedo et al. |
| 8,466,489 B2 | 6/2013 | Salcedo et al. |
| 8,592,860 B2 | 11/2013 | Salcedo et al. |
| 2001/0040254 A1 | 11/2001 | Takiguchi |
| 2002/0021538 A1 | 2/2002 | Chen et al. |
| 2002/0109190 A1 | 8/2002 | Ker et al. |
| 2002/0122280 A1 | 9/2002 | Ker et al. |
| 2002/0187601 A1 | 12/2002 | Lee et al. |
| 2003/0076636 A1 | 4/2003 | Ker et al. |
| 2004/0135229 A1 | 7/2004 | Sasahara |
| 2004/0164351 A1 | 8/2004 | Petruzzello et al. |
| 2004/0164354 A1 | 8/2004 | Mergens et al. |
| 2004/0190208 A1 | 9/2004 | Levit |
| 2004/0207021 A1 | 10/2004 | Russ et al. |
| 2004/0240128 A1 | 12/2004 | Boselli et al. |
| 2005/0012155 A1 | 1/2005 | Ker et al. |
| 2005/0082618 A1 | 4/2005 | Wu et al. |
| 2005/0087807 A1 | 4/2005 | Righter |
| 2005/0088794 A1 | 4/2005 | Boerstler et al. |
| 2005/0093069 A1 | 5/2005 | Logie |
| 2005/0151160 A1 | 7/2005 | Salcedo et al. |
| 2006/0033163 A1 | 2/2006 | Chen |
| 2006/0109595 A1 | 5/2006 | Watanabe et al. |
| 2006/0145260 A1 | 7/2006 | Kim |
| 2006/0186467 A1 | 8/2006 | Pendharkar et al. |
| 2007/0007545 A1 | 1/2007 | Salcedo et al. |
| 2007/0158748 A1 | 7/2007 | Chu et al. |
| 2008/0044955 A1 | 2/2008 | Salcedo et al. |
| 2008/0067601 A1 | 3/2008 | Chen |
| 2009/0032838 A1 | 2/2009 | Tseng et al. |
| 2009/0034137 A1 | 2/2009 | Disney et al. |
| 2009/0045457 A1 | 2/2009 | Bobde |
| 2009/0206376 A1 | 8/2009 | Mita et al. |
| 2009/0230426 A1 | 9/2009 | Carpenter et al. |
| 2009/0236631 A1 | 9/2009 | Chen et al. |
| 2009/0309128 A1 | 12/2009 | Salcedo et al. |
| 2010/0133583 A1 | 6/2010 | Mawatari et al. |
| 2010/0163973 A1 | 7/2010 | Nakamura et al. |
| 2010/0327343 A1 | 12/2010 | Salcedo et al. |
| 2011/0101444 A1 | 5/2011 | Coyne et al. |
| 2011/0110004 A1 | 5/2011 | Maier |
| 2011/0176244 A1 | 7/2011 | Gendron et al. |
| 2011/0284922 A1 | 11/2011 | Salcedo et al. |
| 2011/0303947 A1 | 12/2011 | Salcedo et al. |
| 2011/0304944 A1 | 12/2011 | Salcedo et al. |
| 2012/0007207 A1 | 1/2012 | Salcedo |
| 2012/0008242 A1 | 1/2012 | Salcedo |
| 2012/0199874 A1 | 8/2012 | Salcedo et al. |
| 2012/0205714 A1 | 8/2012 | Salcedo et al. |
| 2012/0293904 A1 | 11/2012 | Salcedo et al. |
| 2013/0032882 A1 | 2/2013 | Salcedo et al. |
| 2013/0208385 A1 | 8/2013 | Salcedo et al. |
| 2013/0242448 A1 | 9/2013 | Salcedo et al. |
| 2013/0270605 A1 | 10/2013 | Salcedo et al. |

FOREIGN PATENT DOCUMENTS

| | | |
|---|---|---|
| EP | 1 703 560 A2 | 9/2006 |
| KR | 10-2006-0067100 | 2/2006 |
| KR | 10-2009-0123683 | 12/2009 |
| KR | 10-2010-0003569 | 1/2010 |

OTHER PUBLICATIONS

Luh et al. *A Zener-Diode-Activated ESD Protection Circuit for Sub-Micron CMOS Processes*, Circuits and Systems, IEEE International Symposium, May 28-31, 2000, Geneva, Switzerland, 4 pages.

Salcedo et al., *Electrostatic Discharge Protection Framework for Mixed-Signal High Voltage CMOS Applications*, IEEE Xplore, downloaded Feb. 23, 2010 at 12:53 EST, 4 pages.

Parthasarathy, S., Salcedo, J.A., Hajjar, J., Analog Devices, Wilmington, MA, USA, Design of SCR Devices for SiGe BiCMOS Applications, Bipolar/BiCMOS Circuits and Technology Meeting (BCTM), 2011 IEEE, p. 235-238.

Salcedo et al., *Bidirectional Devices for Automotive-Grade Electrostatic Discharge Applications*, IEEE Electron Device Letters, vol. 33, No. 6, Jun. 2012, 3 pages.

Salcedo et al., *On-Chip Protection for Automotive Integrated Circuits Robustness*, IEEE 2012 8th International Caribbean Conference on Devices, Circuits and Systems (ICCDCS), 5 pages (2012).

US 8,829,570 B2

SWITCHING DEVICE FOR HETEROJUNCTION INTEGRATED CIRCUITS AND METHODS OF FORMING THE SAME

BACKGROUND

1. Field

Embodiments of the invention relate to electronic systems, and more particularly, to protection systems for heterojunction integrated circuits (ICs).

2. Description of the Related Technology

Certain electronic systems are configured to protect circuits or components therein from transient electrical events. A transient signal event may be in the form of an electrical signal of a relatively short duration having rapidly changing voltage and high power. Transient signal events can include, for example, electrostatic discharge (ESD) events arising from the abrupt release of charge from an object or person to an electronic system.

Transient signal events can damage integrated circuits (ICs) inside an electronic system due to overvoltage conditions and/or high levels of power dissipation over relatively small areas of the ICs. Electronic circuit reliability is enhanced by providing protection devices to the pads of an IC. The protection devices can be incorporated on-chip or at a system-level, and can maintain the voltage level at the pads within a predefined safe range by transitioning from a high-impedance state to a low-impedance state when the voltage of the transient signal reaches a trigger voltage. Thereafter, the protection device can shunt at least a portion of the current associated with the transient signal before the voltage of a transient signal reaches a positive or negative failure voltage that can lead to one of the most common causes of IC damage. After activation, a protection device can remain in the low-impedance state as long as the transient signal voltage level is above a positive holding voltage or below a negative holding voltage.

SUMMARY

According to one embodiment, a heterojunction apparatus is disclosed. The apparatus includes a substrate comprising an insulating material, a sub-collector region formed on the substrate, a collector region formed on the sub-collector region, a first base region and a second base region formed on the collector region, a first base contact region over the first base region, the first base contact region comprising a metal material coupled to a first input terminal, a collector contact region comprising a metal material formed on the sub-collector region, the collector contact region being coupled to the first input terminal, a second base contact region over the second base region, the second base contact region comprising a metal material, wherein the second base contact region is configured to be floating, an emitter region over the second base region; and an emitter contact region over the emitter region, the emitter contact region comprising a metal material coupled to a second input terminal.

According to an embodiment, a heterojunction apparatus is disclosed which includes a parasitic device comprising a first base region, a sub-collector region, a collector region, a collector contact region over the sub-collector region, and a first base contact region over the first base region, the collector contact region and the first base contact region being coupled to a first input terminal, and a NPN bi-polar transistor coupled to the parasitic device, the NPN bi-polar transistor comprising a second base region, a second base contact region over the second base region, wherein the second base contact region is configured to be floating, an emitter region formed over the second base region, and an emitter contact region formed over the emitter region, wherein the emitter contact region is coupled to a second input terminal.

According to an embodiment, a method of manufacturing a heterojunction switching device is disclosed which includes forming a substrate comprising an insulating material, forming a sub-collector region on the substrate, forming a collector region on the sub-collector region, forming a first base region and a second base region on the collector region, forming a first base contact region over the first base region, the first base contact region comprising a metal material, forming a collector contact region comprising a metal material formed on the sub-collector region and separated from the first base contact region by an insulating portion, the collector contact region being coupled to the first base contact region and a first input terminal of the switching device, forming a second base contact region over the second base region such that the second base contact region is configured to be floating, the second base contact region comprising a metal material, forming an emitter region over the second base region, and forming an emitter contact region over the emitter region, the emitter contact region comprising a metal material coupled to a second input terminal.

DETAILED DESCRIPTION OF EMBODIMENTS

Figure 1A:
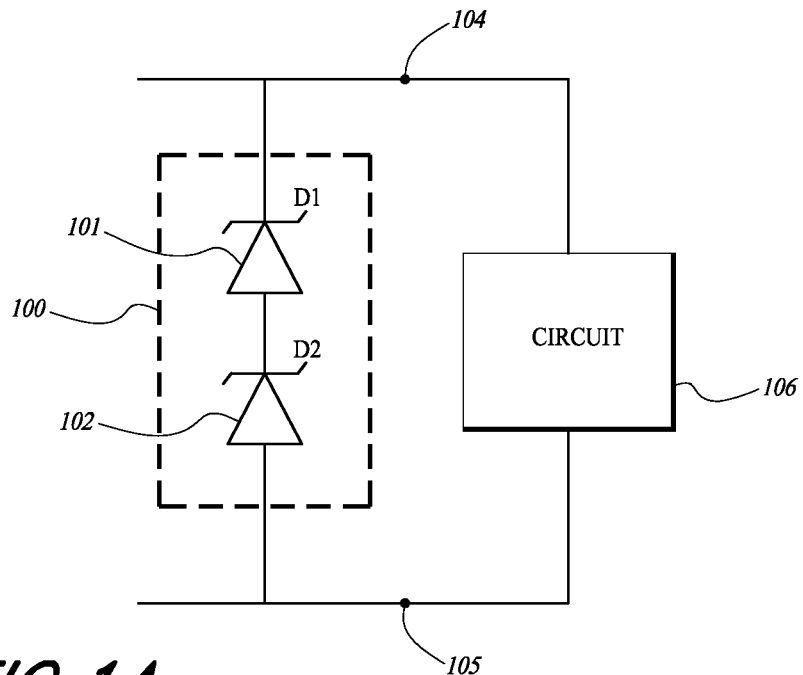
FIG. 1A is a schematic block diagram of an example of a conventional ESD protection device and a circuit.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another.

Some boundaries as shown in the accompanying figures are of this type and are illustrated as abrupt structures merely for the assistance of the reader.

FIG. 1A is a schematic block diagram of an example of a conventional ESD protection device 100 and a circuit 106. The protection device 100 includes first and second low-voltage protection devices 101, 102 connected between a first input node 104 and a second input node 105. As shown in FIG. 1A, the low-voltage protection devices 101 and 102 are configured as diodes. An anode of the second low-voltage protection device 102 is connected to the second input terminal 105 and a cathode of the second low-voltage protection device 102 is connected to an anode of the first low-voltage protection device 101. The cathode of the first low-voltage protection device 101 is connected to the first input terminal 104. The first input terminal 104 is also connected to a first input of a circuit 106 and the second input terminal 105 is connected to a second input of the circuit 106. The circuit 106 may be an integrated circuit (IC) that is to be protected from ESD or other undesirably high voltage. As shown, the protection device 100 is electrically connected in parallel to the circuit 106. In the structure shown in FIG. 1A, the first input terminal 104 and the second input terminal 105 are configured to be coupled to a voltage signal such that a positive potential difference between the first input terminal 104 and the second input terminal 105 is transmitted to the protection device 100 and the circuit 106. Therefore, as shown, the protection device 100 is connected to the first input terminal 104 and the second input terminal 105 in a reverse bias configuration.

In operation, when the voltage difference between the input terminals 104, 105 is less than a predetermined threshold voltage, the protection device 100 effectively functions as an open-circuit and presents a high resistance in parallel with the circuit 106. The threshold voltage is based on the combined breakdown voltages of the low-voltage protection devices 101, 102. When the voltage difference between the input terminals 104, 105 exceeds the predetermined threshold voltage, the protection device 100 presents a relatively low resistance path and conducts current from the first input terminal 104 to the second input terminal 105, thus reducing the voltage at the first input terminal 104. The value of the predetermined threshold voltage of protection device 100 can be determined by adjusting the number of low-voltage protection devices, such as low-voltage protection devices 101, 102.

Figure 1B:
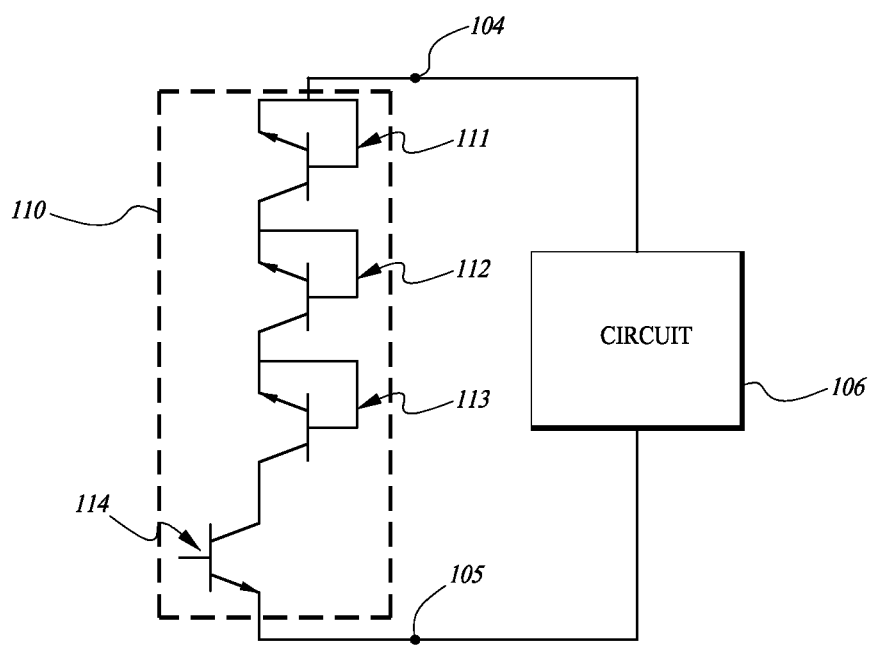
FIG. 1B is a schematic block diagram of another example of a conventional ESD protection device and a circuit.

FIG. 1B is a schematic block diagram of another example of a conventional ESD protection device 110 and a circuit 106. The protection device 110 of FIG. 1B includes three bipolar transistors 111, 112, 113 which are configured to operate in a forward diode mode. The series connected bipolar transistors 111, 112, 113, are connected to a bipolar transistor 114 that is configured as a switching mode circuit having a floating base. The protection device 110 shown in FIG. 1B functions similarly to the device of FIG. 1A described above. That is, both devices 100, 110 are used to clamp the maximum voltage difference between the first input terminal 104 and the second input terminal 105 that is connected to the circuit 106. The clamping voltage occurs at the sum of the predetermined breakdown voltage for the diodes 101, 102 in FIG. 1A or the sum of the series combination of forward drops the bipolar transistors 111, 112, 113, which are configured in a forward diode configuration, and the breakdown voltage of the open-base bipolar transistor 114 in FIG. 1B.

A typical size for a protection device as shown in FIGS. 1A and 1B which is capable of sustaining a maximum ESD-type 10-ns rise time/100-ns pulse width transmission line pulsed (TLP) current of 1.5 A (approximately equivalent to 2 kV ESD human-body-model (HBM) stress voltage) is on the order of about 160×60 µm². The size and associated capacitance of the devices of FIGS. 1A and 1B may pose further performance constraints as the target operating voltage of precision high frequency circuits increases, for example, surpassing a 15V operation level.

Figure 2:
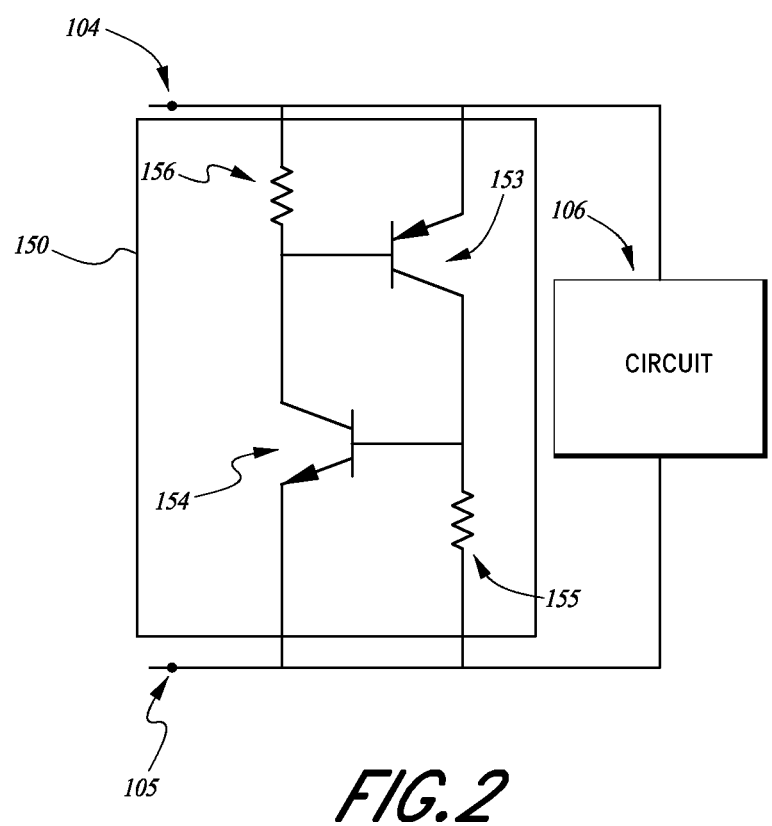
FIG. 2 is a schematic block diagram of an example of an ESD protection device configured as a silicon controlled rectifier (SCR) connected to a circuit.

FIG. 2 is a schematic block diagram of an example ESD protection device 150 configured as a silicon controlled rectifier (SCR) connected to a circuit 106. The device 150 includes a PNP bipolar junction transistor 153 and a NPN bipolar junction transistor 154. The PNP bipolar junction transistor 153 includes an emitter coupled to the first input terminal 104, a collector coupled to a first resistor 155 and to a base of the NPN bipolar transistor 154. A base of the PNP bipolar junction transistor 153 is coupled to a second resistor 156 and to the collector of the NPN bipolar junction transistor 154. A first end of the first resistor 155 is coupled to the base of the NPN bipolar junction transistor 154 and to the collector of the PNP bipolar transistor 153, and a second end of the first resistor 155 is coupled to the second input terminal 105. A first end of the second resistor 156 is coupled to the first input terminal 104, while a second end of the second resistor 156 is coupled to the base of the PNP bipolar transistor 153 and to the collector of the NPN bipolar transistor 154.

When the voltage difference between the first input terminal 104 and the second input terminal 105 is less than the breakdown voltage of the N-P junction at the collector of the NPN bipolar transistor 154, a small amount of leakage current can flow through the device 150 from the first input terminal 104 to the second input terminal 105. However, when the voltage difference between the first input terminal 104 and the second input terminal 105 exceeds the breakdown (for example, "trigger") voltage of the N-P junction at the collector of the NPN bipolar transistor 154, the NPN bipolar transistor 154 will begin to conduct current. The collector of the NPN bipolar transistor 154 will draw current from the base of PNP bipolar transistor 153. As a result, the PNP bipolar transistor 153 will also begin to conduct current. The PNP bipolar transistor 153, in turn, provides current to the base of NPN bipolar transistor 154, driving NPN bipolar transistor 154 further into a conducting mode. Thus, once triggered, the PNP bipolar transistor 153 and the NPN bipolar transistor 154 are in a positive-feedback relationship that will be maintained as long a voltage difference between the first input terminal 104 and the second input terminal 105 is greater than the trigger voltage. The protection device 150 presents a high resistance in parallel with the circuit 106 until the trigger voltage is reached, but thereafter present a low resistance path for current to flow in a direction from the first input terminal 104 to the second input terminal 105 to protect the circuit 106 during a transient event (such as an electrostatic discharge event).

Figure 3:
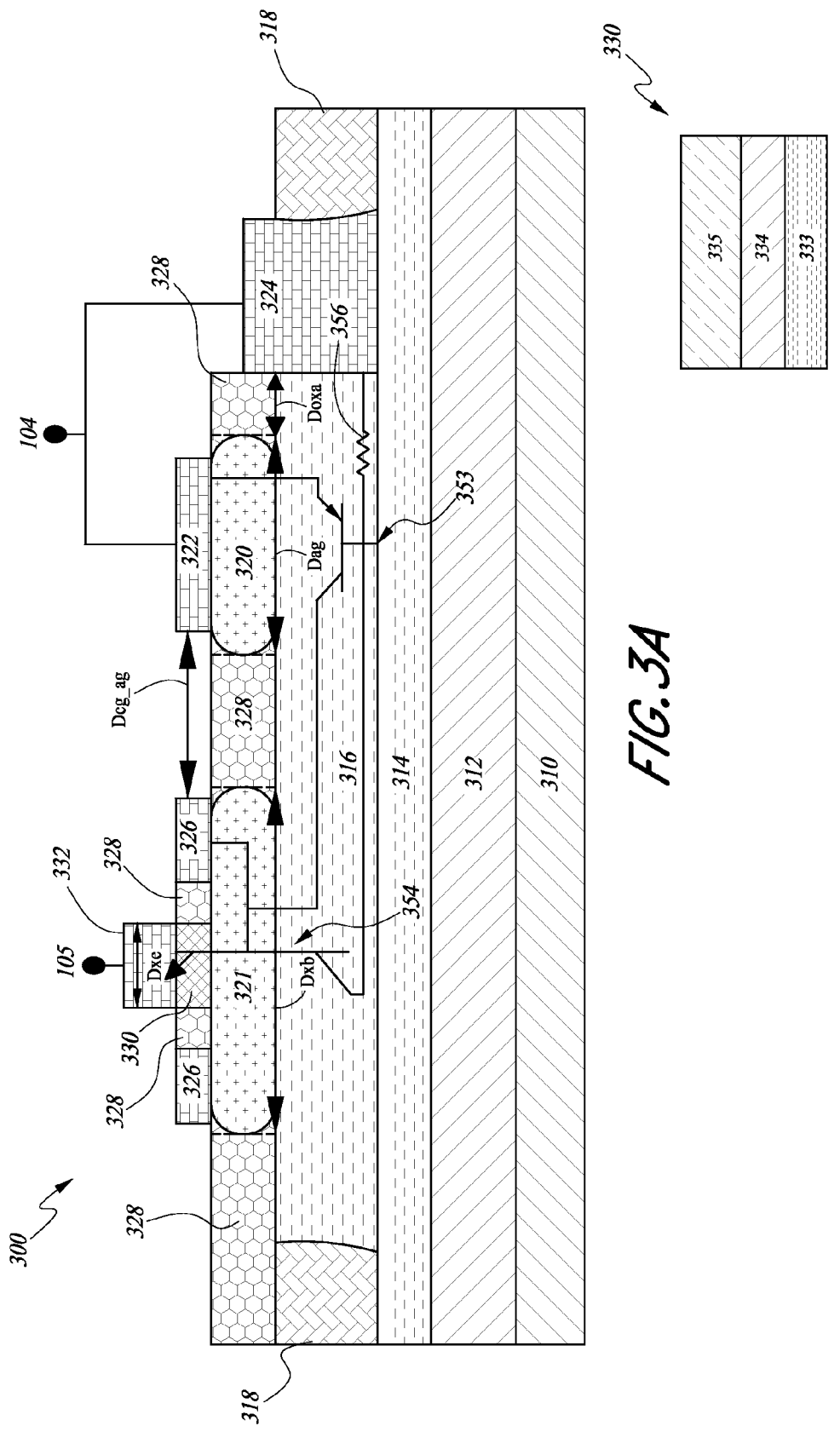
FIG. 3A is a cross-section of an example of a switching device according to some embodiments.
FIG. 3B is a cross-section of an example of a structure for an emitter region of FIG. 3A according to some embodiments.

FIG. 3A is a cross-section of a switching device according to some embodiments. As shown in FIG. 3A, a switching device 300 includes a substrate 312 comprising a semiconductor material. For example, the substrate 312 can comprise a gallium arsenide (GaAs) material. In one embodiment, the substrate 312 may be an intrinsic substrate having a low doping concentration. For example, the substrate 312 may comprise an intrinsic GaAs material having a doping concentration of about $1 \times 10^{12}$ atoms/cm³. The substrate 312 has a thickness within a range of about 80 µm to about 150 µm, for example about 100 µm. A plating layer 310 is formed on one surface of the substrate 312. The plating layer 310 may comprise a highly conductive metal. In one example, the plating layer 310 comprises gold (Au). A sub-collector region 314 is formed on a surface of the substrate 312 that is opposite to the surface of the plating layer 310. The sub-collector region 314 has a thickness in the range of about 4000 Å to about 6000 Å, for example about 5000 Å. The sub-collector region 314 may comprise a N-type semiconductor. For example, the sub-collector region 314 may comprise a GaAs material doped with silicon (Si) at a doping concentration within the range of about $1\times10^{18}$ atoms/cm$^3$ to about $1\times10^{19}$ atoms/cm$^3$.

A collector region 316 is formed above the sub-collector region 314. The collector region 316 has a thickness of about 5000 Å to about 8000 Å, for example about 6500 Å. The collector region 316 may comprise a N-type semiconductor. For example, the collector region 316 may comprise a GaAs material doped with silicon (Si) at a doping concentration within the range of about $1\times10^{17}$ atoms/cm$^3$ to about $1\times10^{18}$ atoms/cm$^3$. The collector region 316 is in contact with a collector contact region 324 also formed on a surface of the sub-collector region 314. In one embodiment, the collector contact region 324 may be formed of one or more highly conductive metals, such as gold (Au), germanium (Ge), nickel (Ni), titanium (Ti) or the like, and has a thickness that is about 500 Å greater than the thickness of the collector region 316. Other applicable materials and thicknesses will be readily determined by one of ordinary skill in the art. In some embodiments, the collector contact region 324 has a layered structure of Au/Ge/Ni/Ti and has a total thickness of about 5500 Å to about 8500 Å. In the configuration of FIG. 3A, the sub-collector region 314 may act as an additional low resistivity negatively-doped region to provide a low resistance ohmic contact between the collector region 316 and collector contact region 324. An insulating region 318 (for example, silicon oxide, silicon nitride, or the like) is formed above the sub-collector region 314 in an area that does not include the collector region 316 and the collector contact region 324 as shown in FIG. 3A.

At least two base regions 320, 321 are formed over the collector region 316 as shown in FIG. 3A. While described below in the context of one embodiment, the skilled practitioner will appreciate that other materials and doping concentrations can be used. The base regions 320, 321 may include a P-type semiconductor material. For example, the base regions 320, 321 may include a GaAs material doped with carbon (C) at a doping concentration of about $8\times10^{18}$ atoms/cm$^3$ to about $8\times10^{19}$ atoms/cm$^3$, for example about $4\times10^{19}$ atoms/cm$^3$. For example, the base regions 320, 321 can have a thickness of about 800 Å to about 1000 Å, for example about 900 Å. For example, the first base region 320 can have a width Dag extending along a surface of the collector region 316 within a range of about 5 µm to about 8 µm, for example about 6 µm. For example, the second base region 321 can have a width Dxb extending along a surface of the collector region 316 within a range of about 8 µm to about 14 µm, for example about 12 µm. The edges of the first base region 320 and the second base region 321 may be curved as shown in FIG. 3A in order to provide an increased field gradient, thereby improving an electrostatic field strength of the base regions 320, 321. The second base region 321 is separated from the first base region 320, and the first base region 320 is separated from the collector contact region 324 by an insulating material 328 as shown in FIG. 3A. The insulating material 328 may comprise any suitable insulating material, such as silicon nitride (SiN$_x$), and can have a thickness of about 800 Å to about 1000 Å, for example about 900 Å.

The first base region 320 is separated from the collector contact region 324 along the surface of the collector region 316 by a distance Doxa which can have a value in the range of about 2 µm to about 5 µm, for example about 2.5 µm. A first base contact region 322 is formed over the first base region 320 and is connected to a first input terminal 104. The first base contact region 322 may comprise one or more metallic materials, such as platinum (Pt), titanium (Ti), and gold (Au), or the like, and can have a thickness of about 400 Å to about 600 Å, for example about 500 Å. In some embodiments, the first base contact region 322 has a multi-layered structure of Pt/Ti/Pt/Au and a combined thickness of about 500 Å. Other materials and thicknesses will be readily determined by one of ordinary skill in the art. The first input terminal 104 is also connected to the collector contact region 324. In one example, the first base contact region 322 is separated (along a surface of the insulating material 328) from a second base contact region 326 formed over the second base region 321 by a distance Dcg_ag having a value within the range of about 4 µm to about 8 µm, for example about 5 µm. The distances between the various regions as discussed with reference to FIG. 3A are summarized in Table 1 below:

TABLE 1

| Spacing in FIG. 3A | Spacing Range (µm) |
| --- | --- |
| Dxb | 8 to 14 |
| Dxe | 1.5 to 3 |
| Dcg_ag | 4 to 8 |
| Dag | 5 to 8 |
| Doxa | 2 to 5 |

In some embodiments, the position of the collector contact region 324 may be alternated with the position of the first base contact region 322 and the first base region 320. In the alternative configuration (not shown), the collector contact region 324 is positioned centrally between the second base region 321 and the first base region 320 (having the first base contact region 322 formed thereon). Further, in the alternative arrangement, a distance between the collector contact region 324 and the second base contact region 326 may correspond to a distance Dag having a value in the range of about 5 µm to about 8 µm (for example, about 6 µm), while a distance between the collector contact region 324 and the first base region 320 may correspond to the distance Doxa having a value in the range of about 2 µm to about 5 µm (for example, about 2.5 µm).

An emitter region 330 is formed over the second base region 321 as shown in FIG. 3A. The emitter region 330 includes a N-type semiconductor. One example of the structure of the emitter region 330 will be described in greater detail with reference to FIG. 3B below. As discussed above, the second base contact region 326 is formed above the second base region 321 and is separated from the emitter region 330 along the surface of the second base region 321 by an insulating material 328. For example, the second base contact region 326 may have a thickness of about 400 Å to about 600 Å, for example about 500 Å. In some embodiments, the second base contact region 326 comprises one or more metals and a similar structure to the first base contact region 322. For example, the second base contact region 326 may have a multi-layered structure of Pt/Ti/Pt/Au and a combined thickness of about 500 Å. Other materials and thicknesses will be readily determined by one of ordinary skill in the art.

An emitter contact region 332 is formed over the emitter region 330 as shown in FIG. 3A and is configured to connect the emitter region 330 to a second input terminal 105. The emitter contact region 332 has a width Dxe along the surface of the emitter region 330 within the range of about 1.5 µm to about 3 µm, for example about 2 µm. The emitter contact region 332 may comprise one or more metals, such as titanium (Ti), platinum (Pt), gold (Au), or the like, and has a thickness in the range of about 400 Å to about 600 Å. In some embodiments, the emitter contact region 332 has a layered structure comprising Ti/Pt/Au having a combined thickness of about 500 Å. Other materials and thicknesses will be readily determined by one of ordinary skill in the art.

In the configuration of FIG. 3A, the first input terminal 104 is configured as an anode of the switching device 300 and is configured to receive a signal at a first voltage level V1 during operation of the circuit 106. The second input terminal 105 is configured as a cathode of the switching device 300 and is configured to receive a signal at a second voltage level V2 during operation of the circuit 106. When the voltages are applied during operation of the circuit 106, the voltage difference V1-V2 is configured to have a positive polarity. For example, the second input terminal 105 may be connected to ground (0V) while the first input terminal 104 may be connected to a voltage signal having a positive polarity (for example, +15V or more). In some embodiments, the switching device 300 is configured to operate with a voltage difference of greater than 20V DC and protect a circuit 106 that is connected to the switching device 300 as will be discussed in greater detail later with reference to FIG. 4.

FIG. 3B is a cross-section for an emitter region 330 of FIG. 3A according to some embodiments. The emitter region 330 includes a N-type emitter region 333 formed over the second base region 321. The N-type emitter region 333 comprises a donor-doped semiconductor material. For example, in some embodiments, the N-type emitter region 333 comprises an indium gallium phosphide (for example, $In_{0.5}Ga_{0.5}P$) doped with silicon (Si) at a doping concentration in the range of about $4 \times 10^{17}$ atoms/cm$^3$ to about $2 \times 10^{10}$ atoms/cm$^3$. For example, the N-type emitter region 333 can have a thickness in the range of about 900 Å to about 1500 Å, for example about 1000 Å. An emitter substrate 334 is formed over the N-type emitter region 333. The emitter substrate 334 comprises a semiconductor material, such as gallium arsenide (GaAs), and in one example, has a thickness in the range of about 600 Å to about 1200 Å, for example about 800 Å. An emitter semiconductor alloy 335 is formed over the emitter substrate 334. The emitter semiconductor alloy 335 may comprise a material such as indium gallium arsenide (for example, $In_{0.25}Ga_{0.75}As$) having a thickness in the range of about 400 Å to about 600 Å, for example about 500 Å. A surface of the emitter semiconductor alloy 335 is in contact with the emitter contact region 332. Other materials and thicknesses will be readily determined by one of ordinary skill in the art.

In one example, a plating layer 310 is formed of Au on a surface of a GaAs substrate 312. The substrate 312 has a thickness of 100 μm and a doping concentration of $1 \times 10^{12}$ atoms/cm$^3$. In the example, a GaAs sub-collector region 314 doped with Si is formed on another surface of the substrate 312. Further, a collector contact region 324 is formed of a metal having an Au/Ge/Ni/Ti structure, and the collector region 316 is formed of a GaAs material doped with Si. In the example, the first base region 320 and the second base region 321 are formed of a GaAs material doped with C. Further, the first base contact region 322 and the second base contact region 326 are formed of a metal having a Pt/Ti/Pt/Au structure. In the example, the emitter region 330 includes an N-type emitter region 333 formed of $In_{0.5}Ga_{0.5}P$, an emitter substrate 334 formed of GaAs, and an emitter alloy region 335 formed of $In_{0.25}Ga_{0.75}As$. In the example, an emitter contact region 332 is formed of a metal having a Ti/Pt/Au structure. Further, in the example, the spacing of the layers as shown in FIG. 3A corresponds to the values shown in Table 2 below:

TABLE 2

| Spacing in FIG. 3A | Spacing (μm) |
|---|---|
| Dxb | 12 |
| Dxe | 2 |
| Dcg_ag | 5 |
| Dag | 6 |
| Doxa | 2.5 |

One of skill in the art will recognize that the above described combination of materials, thicknesses, and distances is one example of the materials, thicknesses, and distances for a switching device 300 as described with reference to FIG. 3A. As discussed above, other materials, thicknesses, and distances may also be used within the scope of this invention.

Returning now to FIG. 3A, a vertical P-N junction is formed between the P-type first base region 320 and the N-type collector region 316. Further, through the collector contact region 324 and the first base contact region 322, the P-type first base region 320 is coupled to the N-type collector region 316 and the N-type sub-collector region 314. The N-type collector region 316 and the N-type sub-collector region act as injection and recombination centers for the switching device 300. The resulting equivalent circuit includes a region-effective resistor 356 as shown in FIG. 3A connected between the first input terminal 104 (through the collector contact region 324) and a parasitic device 353. The parasitic device 353 is a p-type majority carrier injector that functions similarly to a PNP transistor as shown in FIG. 3A, however, the use of a PNP transistor in FIG. 3A is only for ease of illustration and description of the functionality of the parasitic device 353.

Further, as shown in FIG. 3A, a vertical N-P junction is formed between the N-type emitter region 333 and the P-type second base region 321. A vertical P-N junction is formed between the P-type second base region 321 and the N-type collector region 316. As shown in FIG. 3A, an equivalent NPN bipolar transistor is formed in a region of the second input terminal 105 (herein, second terminal region) and is illustrated as a NPN transistor 354. The NPN transistor 354 includes a floating base as illustrated by the floating connection of the second base region 321 and second base contact region 326, thereby exhibiting low leakage current during normal operation (for example, low DC leakage current). Further, the spacing between the first base contact region 322, collector contact region 324, and second base contact region 326 enables capacitive coupling between the first base region 320, the second base region 321, and the collector region 316. As a result, upon stress (for example, during an ESD event), a low impedance conduction path between the first base contact region 320, the second base contact region 321, and the collector region 316 is provided, thereby facilitating conduction and expediting the response time of the switching device 300 to a transient event.

The switching device 300 described above with reference to FIGS. 3A and 3B may be used as a protection device to protect a circuit from transient events (for example, ESD events). The switching device 300 may be configured to operate for operating voltages of greater than 20V.

Figure 4:
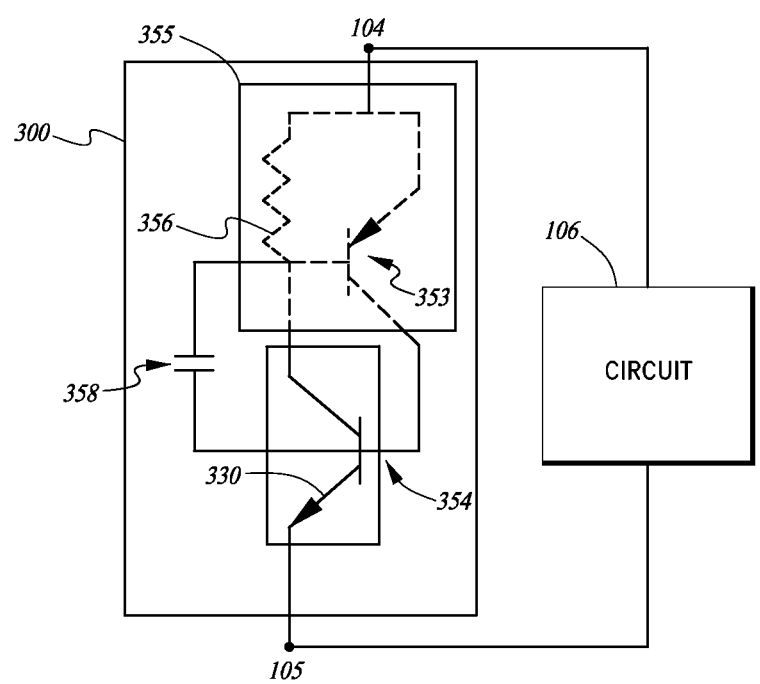
FIG. 4 is an example of an equivalent circuit diagram of the switching device of FIG. 3A.

FIG. 4 shows an equivalent circuit diagram of the ESD protection device of FIG. 4 according to some embodiments. The equivalent circuit diagram shown in FIG. 4 is only illustrated for ease of description of the operation of the switching device 300 and one of ordinary skill in the art will recognize that the structures illustrated in FIG. 3A do not necessarily correspond to the equivalent circuit components relied upon for the description of the functionality of the switching device 300. Further, while the parasitic device 353 is illustrated as coupled to the NPN transistor 354, the connections between the various nodes correspond to conductive paths between the nodes, including through capacitive coupling as discussed above in FIG. 3A. In operation, when the voltage difference between the first input terminal 104 and the second input terminal 105 is less than the breakdown voltage of the N-P junction at the collector of the NPN transistor 354, substantially no current flows through the switching device 300 and the voltage supplied through the first input terminal 104 and the second input terminal 105 is applied to the circuit 106. When the voltage difference between the first input terminal 104 and the second input terminal 105 exceeds the breakdown or trigger voltage of the N-P junction at the collector of the NPN transistor 354, current flows through the NPN transistor 354 drawing an equal amount of current through the region-effective resistor 356. Further, as discussed above, the base of the hole carriers injector parasitic device 353 and the base of the NPN transistor 354 are capacitively coupled (as illustrated by effective coupling capacitor 358). During a transient event exhibiting a particular stress level, the capacitor 358 acts as a low impedance conductive path between the effective base of the parasitic device 353 and the base of the NPN transistor 354.

The region-effective resistor 356 can be formed using, for example, the resistivity of doped regions to achieve a target resistance value. For example, in one embodiment, the region-effective resistor 356 is implemented by using the resistivity of the N-type collector region 316 as shown in FIG. 3A to achieve a desired stability during operation and a desired turn-on speed for a particular application. For example, the resistance of the region-effective resistor 356 can be selected to obtain a desired voltage difference to forward-bias the effective emitter-base junction of the parasitic device 353.

As current flows through the region-effective resistor 356, the voltage drop from the first input terminal 104 to the effective base of the parasitic device 353 causes the parasitic device 353 to conduct current from the first input terminal 104 through the effective emitter and effective collector of the parasitic device 353, and to the base of the NPN transistor 354. The parasitic device 353, in a conducting state, provides current to the base of the NPN transistor 354, driving NPN bipolar transistor 354 further into a conducting mode. Thus, once triggered, the parasitic device 353 and the NPN transistor 354 are in a positive-feedback relationship that will be maintained as long a voltage difference between the first input terminal 104 and the second input terminal 105 is greater than the trigger voltage. While the base of the NPN transistor 354 is illustrated as being coupled to an effective collector of the parasitic device 353, as discussed above with reference to FIG. 3A, the second base region 321 of the NPN transistor 354 is electrically floating as shown in FIG. 3B. However, the connection between the base of the NPN transistor 354 and the effective collector of the parasitic device as shown in FIG. 4 is partly due to capacitive coupling between the second base contact region 326 and the collector contact region 324 as discussed above with reference to FIG. 3A.

The switching device 300 presents a high resistance in parallel with circuit 106 until the trigger voltage is reached, but thereafter present a low resistance path for current to flow in a direction from the first input terminal 104 to the second input terminal 105 to protect circuit 106 during a high-voltage event (such as an electrostatic discharge event). Further, the structure of the switching device 300 as described above with reference to FIG. 3A provides a high breakdown or trigger voltage for the NPN transistor 354 thereby reducing the amount of leakage current through the switching device 300 while in the non-conductive state. This functionality is achieved based on the spacing and connections of the regions as described above with reference to FIG. 3A, which allows capacitive coupling between the second base contact region 326, the coupled first base contact region 322, and the collector contact region 324.

Figure 5A:
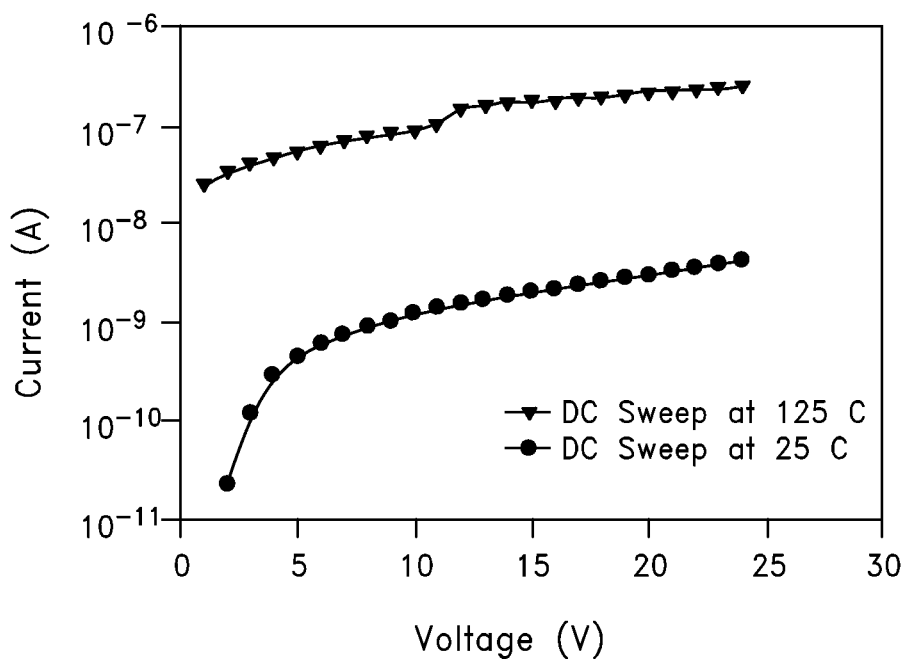
FIG. 5A is a graph of DC current versus DC voltage at different temperatures for the switching device of FIG. 3A.
Figure 5B:
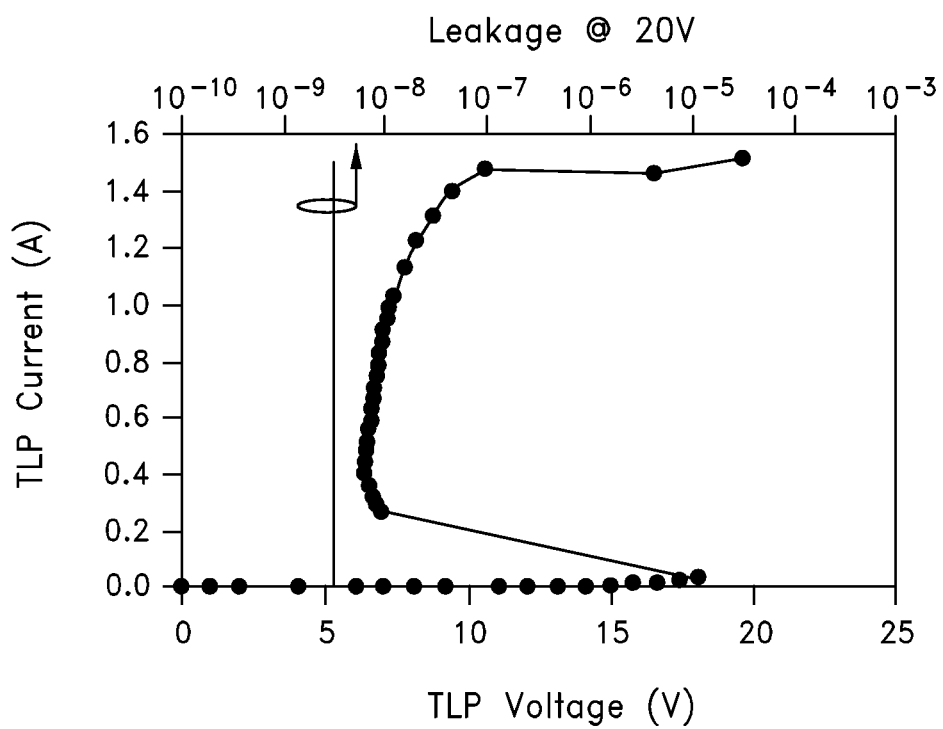
FIG. 5B is a graph of transmission line pulse (TLP) test results for the switching device of FIG. 3A.
Figure 5C:
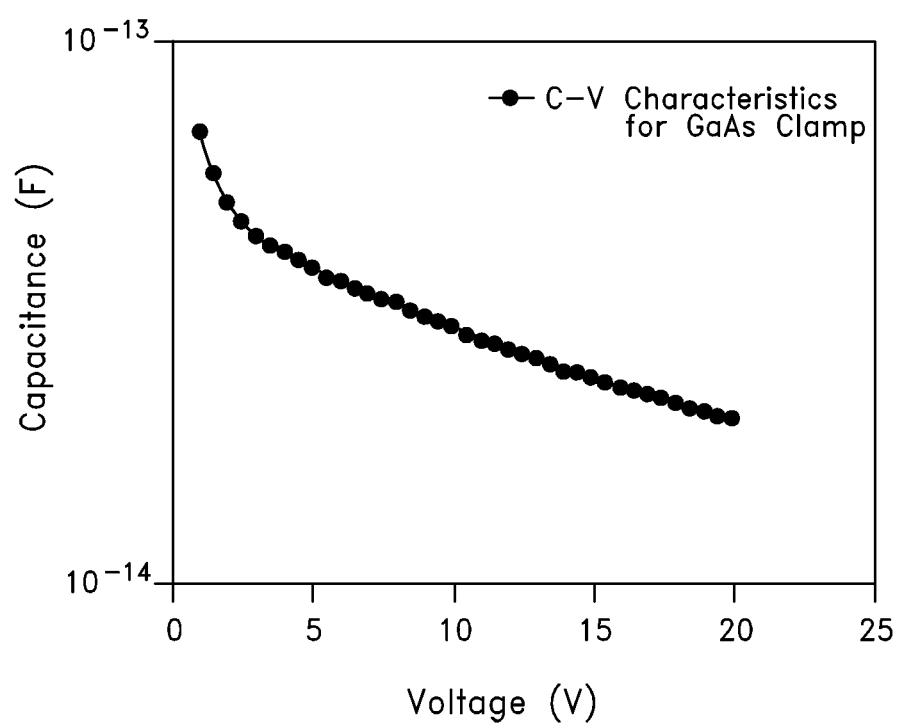
FIG. 5C is a graph showing capacitance versus voltage of the switching device of FIG. 3A.

FIGS. 5A-5C illustrate laboratory data for examples of performance characteristics of the switching device 300. FIG. 5A corresponds to a DC sweep plot, and FIG. 5B corresponds to TLP test results showing a voltage and a current measurement obtained by forcing a rectangular 100 ns current pulse having about a 2 ns rise time into the switching device 300 and measuring the voltage of the switching device 300 between about 40% and about 90% of the rectangular pulse width. Each point in FIG. 5B corresponds to an average of the measurement for each rectangular pulse.

FIG. 5A shows a first plot corresponding to a DC sweep at 25° C. and a second plot corresponding to a DC sweep at 125° C. The plots show a DC current versus DC voltage at the different temperatures. As shown in FIG. 5A, during normal operating condition, the device behaves close to an open circuit, with the leakage current in a range that is less than about 10 nA over 20V when tested at 25° C. At 125° C., the voltage sweep also shows that the leakage current of the switching device 300 remains within in a range that is less than about 0.5 μA over 20V. Further, as shown in FIG. 5A, the switching device 300 does not enter a conductive state even at voltages close to about 25V DC.

FIG. 5B is a graph of transmission line pulse (TLP) test results for a switching device of FIG. 3A. The TLP curves of the switching device 300 as shown in FIG. 5B includes an I-V curve and a plot of leakage current after applying ESD pulses. The graph indicates that switching device has a transient response trigger voltage of about 18V volts. Therefore, even though the DC breakdown voltage is greater than 20V as discussed above with reference to FIG. 5A, the transient response of the switching device 300 exhibits a lower transient trigger voltage than conventional devices, which enables a relatively low standing leakage current. As a result, a circuit coupled to the switching device 300 can be protected from core circuit overstress during a stress condition. The switching device 300 also exhibits a fast trigger response for effective protection of core devices connected to a circuit pin being protected. Further, as one of ordinary skill in the art will recognize, a relatively small variation in the leakage current value after each pulse can indicate the integrity of the IC. In contrast, drastic change in the leakage current can indicate IC damage. As shown in FIG. 5B, the switching device 300 maintains stable operation up to a TLP current of greater than about 1.3 Amps as indicated in FIG. 5B, and to a current of about 1.5 Amps. At that point, the switching device 300 begins to exhibit a high voltage drop and greater variation of leakage current between the TLP pulse measurement points as shown in FIG. 5B.

FIG. 5C is a graph showing capacitance versus voltage of a switching device of FIG. 3A. As shown in FIG. 5C, the switching device 300 including a GaAs semiconductor substrate exhibits a very low capacitance between $10^{-13}$ and $10^{-14}$ F. Further, the switching device 300 exhibits a relatively low variation in capacitance with varying voltages in the range of 0V-20V. As shown in FIG. 5C, the switching device 300 exhibits a capacitance of less than about 200 fF at a 20V operating voltage. Further, as discussed above, the switching device 300 has an area of 65×55 µm$^2$, thereby exhibiting a lower capacitance per unit area than conventional ESD protection devices and therefore, exhibits less parasitic interference during operation of a circuit coupled to the switching device 300. As illustrated in FIGS. 5A-5C, relative to existing conventional ESD devices, the switching device 300 is configured to achieve a target maximum TLP current level of 1.5 Amps while occupying less than up to 37% of the area of an existing conventional device configured to sustain a similar level of stress.

Applications

Devices employing the above described schemes can be implemented into various high performance and high speed electronic devices and interface applications operating in harsh electrical environments. Examples of the electronic devices can include, but are not limited to, consumer electronic products, parts of the consumer electronic products, electronic test equipment, high robustness industrial and automotive applications, etc. Examples of the electronic devices can also include circuits of optical networks or other communication networks. The consumer electronic products can include, but are not limited to, an automobile, a vehicle engine management controller, a transmission controller, an anti-lock brake system controller, a camcorder, a camera, a digital camera, a portable memory chip, a multi functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A heterojunction apparatus comprising:
a substrate comprising an insulating material;
a sub-collector region formed on the substrate;
a collector region formed on the sub-collector region;
a first base region and a second base region formed on the collector region;
a first base contact region over the first base region, the first base contact region comprising a metal material coupled to a first input terminal;
a collector contact region comprising a metal material formed on the sub-collector region, the collector contact region being coupled to the first input terminal;
a second base contact region over the second base region, the second base contact region comprising a metal material, wherein the second base contact region is configured to be floating;
an emitter region over the second base region; and
an emitter contact region over the emitter region, the emitter contact region comprising the metal material coupled to a second input terminal.

2. The apparatus of claim 1, wherein the first input terminal is defined at a first input of a circuit to be protected and the second input terminal is defined at a second input of a circuit to be protected.

3. The apparatus of claim 1, wherein the emitter region includes a N-type semiconductor material.

4. The apparatus of claim 1, further comprising a plating metal layer on a surface of the substrate opposite to the surface having the sub-collector region.

5. The apparatus of claim 1, wherein the substrate comprises gallium arsenide (GaAs).

6. The apparatus of claim 1, wherein the first and second base regions comprise a P-type semiconductor.

7. The apparatus of claim 6, wherein the P-type semiconductor comprises a gallium arsenide (GaAs) substrate doped with carbon (C).

8. The apparatus of claim 1, wherein the first base region has a width of about 5 µm to about 8 µm, and wherein the second base region has a width of about 8 µm to about 14 µm.

9. The apparatus of claim 1, wherein the first input terminal is configured to receive a voltage at a first voltage level and the second input terminal is configured to receive a voltage at a second voltage level that is less than the first voltage level.

10. The apparatus of claim 1, wherein the emitter contact region has a width of about 1.5 µm to about 3 µm.

11. The apparatus of claim 1, wherein the collector contact region is separated from the first base region along a surface of the collector region by a distance of about 2 µm to about 5 µm.

12. The apparatus of claim 1, wherein the first base region is separated from the second base region by an insulating material formed over the collector region, and wherein the first base contact region is separated from the second base contact region along a surface insulating material by a distance of about 4 µm to about 8 µm.

13. A heterojunction apparatus comprising:
a parasitic device comprising a first base region, a sub-collector region, a collector region, a collector contact region over the sub-collector region, and a first base contact region over the first base region, the collector contact region and the first base contact region being coupled to a first input terminal; and
a NPN bi-polar transistor coupled to the parasitic device, the NPN bi-polar transistor comprising a second base region, a second base contact region over the second base region, wherein the second base contact region is configured to be floating, an emitter region formed over the second base region, and an emitter contact region formed over the emitter region, wherein the emitter contact region is coupled to a second input terminal.

14. The apparatus of claim 13, wherein the collector region has a resistance value configured to forward bias the parasitic device.

15. The apparatus of claim 13, wherein the NPN bi-polar transistor is configured to conduct current when a voltage difference between a voltage level at the first input terminal and a voltage level at the second input terminal is greater than a threshold voltage level.

16. The apparatus of claim 15, wherein the NPN bi-polar transistor is configured to trigger the parasitic device to conduct current when the voltage difference is greater than the threshold voltage.

17. The apparatus of claim 16, wherein the parasitic device is configured to inject current to a base of the NPN bi-polar transistor.

18. The apparatus of claim 13, wherein the NPN bi-polar transistor is capacitively coupled to the parasitic device.

19. The apparatus of claim 13, wherein the apparatus has a capacitance of less than about 200 ff at a 20V operating voltage and an area of about 65×55 $\mu m^2$.

20. The apparatus of claim 13, wherein the first and second base regions comprise a P-type semiconductor.

21. The apparatus of claim 20, wherein the P-type semiconductor comprises a gallium arsenide (GaAs) substrate doped with carbon (C).

22. The apparatus of claim 13, wherein the first base region has a width of about 5 μm to about 8 μm, and wherein the second base region has a width of about 8 μm to about 14 μm.

23. A method of manufacturing a heterojunction switching device comprising:
   forming a substrate comprising an insulating material;
   forming a sub-collector region on the substrate;
   forming a collector region on the sub-collector region;
   forming a first base region and a second base region on the collector region;
   forming a first base contact region over the first base region, the first base contact region comprising a metal material;
   forming a collector contact region comprising a metal material formed on the sub-collector region and separated from the first base contact region by an insulating portion, the collector contact region being coupled to the first base contact region and a first input terminal of the switching device;
   forming a second base contact region over the second base region such that the second base contact region is configured to be floating, the second base contact region comprising the metal material;
   forming an emitter region over the second base region; and
   forming an emitter contact region over the emitter region, the emitter contact region comprising a metal material coupled to a second input terminal.

24. The method of claim 23, further comprising forming a plating metal layer on a surface of the substrate opposite to the surface having the sub-collector region.

25. The method of claim 23, wherein forming the first and second base regions comprises doping a semiconductor material to form a P-type semiconductor.

26. The method of claim 25, wherein the P-type semiconductor comprises a gallium arsenide (GaAs) substrate doped with carbon (C).

* * * * *

UNITED STATES PATENT AND TRADEMARK OFFICE
CERTIFICATE OF CORRECTION

PATENT NO.         : 8,829,570 B2                                        Page 1 of 1
APPLICATION NO.    : 13/416152
DATED              : September 9, 2014
INVENTOR(S)        : Srivatsan Parthasarathy It is certified that error appears in the above-identified patent and that said Letters Patent is hereby corrected as shown below:

Title Page (item 57, Abstract) at line 16, Change "20V DC." to --20V DC).--.

In the Claims

Col. 13 at line 11 (approx.), In Claim 19, change "200 ff" to --200 fF--.

Signed and Sealed this
Twenty-sixth Day of May, 2015

Michelle K. Lee
*Director of the United States Patent and Trademark Office*